US012677600B2

(12) United States Patent　　(10) Patent No.:　US 12,677,600 B2
Rettner　　(45) Date of Patent:　Jul. 7, 2026

(54) TUNABLE JOSEPHSON JUNCTION WITH ADDED DOPANTS

(71) Applicant: INTERNATIONAL BUSINESS MACHINES CORPORATION, Armonk, NY (US)

(72) Inventor: Charles Thomas Rettner, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 371 days.

(21) Appl. No.: 18/518,349

(22) Filed: Nov. 22, 2023

(65) Prior Publication Data

US 2025/0318445 A1　　Oct. 9, 2025

(51) Int. Cl.
　*H10N 60/80*　　(2023.01)
　*H10N 60/01*　　(2023.01)
　*H10N 60/12*　　(2023.01)

(52) U.S. Cl.
　CPC ....... *H10N 60/805* (2023.02); *H10N 60/0912* (2023.02); *H10N 60/12* (2023.02)

(58) Field of Classification Search
　CPC .... H01L 60/0912; H01L 60/12; H01L 60/805
　See application file for complete search history.

(56) References Cited

U.S. PATENT DOCUMENTS

| | | | |
|---|---|---|---|
| 4,220,959 A | | 9/1980 | Kroger |
| 4,470,190 A | * | 9/1984 | Fulton ................ H10N 60/0912 |
| | | | 427/63 |
| 10,784,432 B2 | | 9/2020 | Rosenblatt |
| 11,049,718 B2 | | 6/2021 | Ni et al. |
| 11,133,452 B2 | | 9/2021 | Chang |
| 11,355,690 B2 | | 6/2022 | Black |
| 11,411,160 B2 | | 8/2022 | Holmes |
| 11,450,798 B2 | * | 9/2022 | Roberts ................ H10N 60/128 |
| 11,522,116 B2 | | 12/2022 | Holmes |
| 11,552,238 B2 | | 1/2023 | Shabani |
| 11,594,473 B2 | | 2/2023 | Or-Bach et al. |
| 2015/0179916 A1 | * | 6/2015 | Pramanik ................ H10N 60/12 |
| | | | 505/190 |
| 2019/0042967 A1 | * | 2/2019 | Yoscovits .......... H10N 70/8833 |
| 2019/0363239 A1 | * | 11/2019 | Yoscovits .......... H10N 60/0912 |
| 2021/0296557 A1 | | 9/2021 | Holmes et al. |
| 2022/0181535 A1 | * | 6/2022 | Holmes ................ H10N 60/128 |
| 2023/0180632 A1 | | 6/2023 | Bronn |
| 2023/0210018 A1 | | 6/2023 | Holmes |

OTHER PUBLICATIONS

Shim, Y. et al., "Bottom-Up Superconducting And Josephson Devices Inside A Group-IV Semiconductor", Nature Communications (2014), 8 pgs.

(Continued)

*Primary Examiner* — David C Spalla

(74) *Attorney, Agent, or Firm* — Amin, Turocy & Watson, LLP

(57) ABSTRACT

A Josephson junction device includes a substrate, a base electrode layer, a top electrode layer, a tunnel barrier layer between the base electrode layer and the top electrode layer, and a dopant layer.

19 Claims, 8 Drawing Sheets

100

Tunnel Barrier 130　　Top Electrode 140
　　　　　　Base Electrode 120
　　　　　　Dopant 150

Substrate 110

(56) References Cited

OTHER PUBLICATIONS

Steffen, Z. et al., "Characterization Of Asymmetric Gap-Engineered Josephson Junction And 3D Transmon Qubits", IEEE Transactions on Applied Superconductivity (2023), vol. 33:5, 5 pgs.

Wind, L. et al., "Composition Dependent Electrical Transport In Si1-xGex Nanosheets With Monolithic Single-Elementary Al Contact", Small (2022), vol. 18:2204178, 9 pgs.

Montemurro, D. et al., "Enhanced Josephson Coupling In Hybrid Nanojunctions", Physical Review B (2023), vol. 107:094517, 11 pgs.

Luethi, M. et al., "Planar Josephson Junctions In Germanium: Effect Of Cubic Spin-Off Interaction", arXiv:2209.12745v2 (2023), 22 pgs.

Hertzberg, J.B. et al., "Laser-annealing Josephson junctions for yielding scaled-up superconducting quantum processors", NPJ Quantum Inf. (2020), vol. 7:129, 16 pgs.

* cited by examiner

100

Top Electrode 140

Base Electrode 120

Dopant 150

Substrate 110

Tunnel Barrier 130

600

FORM THE SUBSTRATE 610

FORM THE BASE ELECTRODE 620

FORM THE TUNNEL BARRIER 630

FORM THE FIRST PORTION OF THE TOP ELECTRODE 640

FORM THE DOPANT LAYER 650

FORM THE SECOND PORTION OF THE TOP ELECTRODE 660

TUNABLE JOSEPHSON JUNCTION WITH ADDED DOPANTS

BACKGROUND

Technical Field

The present disclosure generally relates to Josephson junction-based qubits, and more specifically, to Josephson junction-based qubits with improved resistance and frequency tunability.

Description of the Related Art

As qubit circuits are scaled up, they must maintain high one- and two-qubit gate fidelities, high qubit connectivity, and low crosstalk error, which can be measured in a holistic sense via the quantum volume of the circuit. Lattices of fixed-frequency transmon qubits represent a promising architecture for building systems of larger sizes. Fixed-frequency transmons are largely insensitive to charge or flux noise and have achieved coherence times of 100 μs and growing. A variety of technical challenges confront further system scaling, including improving three-dimensional circuit integration, fast readout, and frequency crowding. Frequency crowding may be mitigated by tuning Josephson junction qubit by annealing, including laser annealing.

SUMMARY

According to an embodiment, a system includes a substrate, a base electrode layer, a top electrode layer, a tunnel barrier layer between the base electrode layer and the top electrode layer, and a dopant layer.

In some embodiments, which can be combined with the previous embodiment, the dopant layer is located between the base electrode layer and the substrate.

In some embodiments, which can be combined with one or more previous embodiments, the dopant layer is located within the top electrode layer.

In some embodiments, which can be combined with one or more previous embodiments, the dopant is operative to change a response of a resistance of the Josephson junction device to heating.

In some embodiments, which can be combined with one or more previous embodiments, the dopant layer is made of silicon or germanium.

In some embodiments, which can be combined with one or more previous embodiments, the dopant layer is made of magnesium, copper, or zirconium.

In some embodiments, which can be combined with one or more previous embodiments, upon the top electrode layer is formed, the semiconductor device is annealed.

In some embodiments, which can be combined with one or more previous embodiments, the base electrode layer has a thickness of about 20 nanometers to about 50 nanometers.

In some embodiments, which can be combined with one or more previous embodiments, the dopant layer has a thickness of about 1 nanometer to about 10 nanometers.

In some embodiments, which can be combined with one or more previous embodiments, the top electrode layer has a thickness of about 50 nanometers to about 100 nanometers.

According to another embodiment, a method of fabricating a Josephson junction device includes forming a substrate, forming a dopant layer over the substrate, forming a base electrode layer over the dopant layer, forming a tunnel barrier layer over the base electrode layer, and forming a top electrode layer over the tunnel barrier layer.

In some embodiments, which can be combined with the previous embodiment, upon forming the top electrode layer, the Josephson junction device is annealed.

In some embodiments, which can be combined with one or more previous embodiments, forming the dopant layer further includes tuning a response of a resistance of the Josephson junction device to heating.

In some embodiments, which can be combined with one or more previous embodiments, the dopant layer is made of silicon or germanium.

In some embodiments, which can be combined with one or more previous embodiments, the dopant layer is made of magnesium, copper, or zirconium.

According to an embodiment, a method of fabricating a Josephson junction device includes forming a substrate, forming a base electrode layer over the substrate, forming a tunnel barrier layer over the base electrode layer, forming a first portion of a top electrode layer over the tunnel barrier layer, forming a dopant layer over the first portion, and forming a second portion of the top electrode layer over the dopant layer.

In some embodiments, which can be combined with the previous embodiment, upon forming the second portion of the top electrode layer, the Josephson junction device is annealed.

In some embodiments, which can be combined with one or more previous embodiments, forming the dopant layer further comprises tuning a response of a resistance of the Josephson junction device to heating.

In some embodiments, which can be combined with one or more previous embodiments, the dopant layer is made of silicon or germanium.

In some embodiments, which can be combined with one or more previous embodiments, the dopant layer is made of magnesium, copper, or zirconium.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
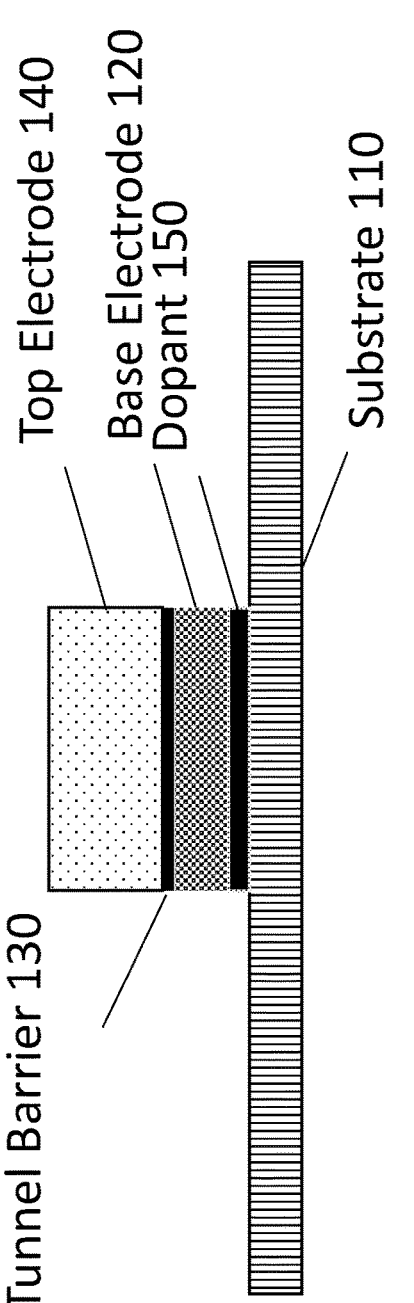
FIG. 1 illustrates a simplified view of the Josephson junction with added dopant, in accordance with some embodiments.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of an element.

As used herein, the term "vertical" describes an orientation that is arranged perpendicular to the first surface of an element.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

According to an embodiment, a system includes a substrate, a base electrode layer, a top electrode layer, a tunnel barrier layer between the base electrode layer and the top electrode layer, and a dopant layer. The dopant can improve the control of the change of resistance/frequency in response to annealing.

In some embodiments, which can be combined with the previous embodiment, the dopant layer is located between the base layer and the substrate. The dopant layer can provide silicon to improve the control of the change of resistance/frequency in response to annealing.

In some embodiments, which can be combined with one or more previous embodiments, the dopant layer is located within the top electrode layer. The dopant layer can be either located between the substrate and the base electrode, or within the top electrode. In either case, the dopant layer can provide dopant, e.g., silicon, to enhance the control of the response of the system to annealing.

In some embodiments, which can be combined with one or more previous embodiments, the dopant layer is configured to change a response of a resistance of the Josephson junction device to heating. The dopant layer provides dopant to the system.

In some embodiments, which can be combined with one or more previous embodiments, the dopant is made of silicon or germanium. Silicon and germanium enhance the response of the system to annealing.

In some embodiments, which can be combined with one or more previous embodiments, the dopant is made of magnesium, copper, or zirconium. Besides silicon and germanium, other metals such as magnesium, copper, and zirconium can enhance the response of the system to annealing.

In some embodiments, which can be combined with one or more previous embodiments, upon the top electrode layer is formed, the Josephson junction device is annealed. The change in the resistance/frequency of the system once the device is heated plays a crucial role in the operation of the system.

In some embodiments, which can be combined with one or more previous embodiments, the base electrode layer has a thickness of about 30 nanometers. The base electrode is thicker than the dopant layer, and thinner than the top electrode.

In some embodiments, which can be combined with one or more previous embodiments, the dopant layer has a thickness of about 10 nanometers. The dopant layer is thinner than other layers of the system.

In some embodiments, which can be combined with one or more previous embodiments, the top electrode layer has a thickness of about 60 nanometers. The top electrode layer is thicker than the other layers of the system.

According to another embodiment, a method of fabricating a Josephson junction device includes forming a substrate, forming a dopant layer over the substrate, forming a base electrode layer over the dopant layer, forming a tunnel barrier layer over the base electrode layer, and forming a top electrode layer over the tunnel barrier layer. The dopant can improve the control of the change of resistance/frequency in response to annealing.

In some embodiments, which can be combined with the previous embodiment, upon forming the top electrode layer, the Josephson junction device is annealed. The change in the resistance/frequency of the device once the device is heated plays a crucial role in the operation of the device.

In some embodiments, which can be combined with one or more previous embodiments, forming the dopant layer further includes tuning a response of a resistance of the Josephson junction device to heating. By providing dopant, e.g., silicon, the dopant layer enables tuning the response of the device to heating.

In some embodiments, which can be combined with one or more previous embodiments, the dopant is made of silicon or germanium. Silicon and germanium enhance the response of the system to annealing.

In some embodiments, which can be combined with one or more previous embodiments, the dopant is made of magnesium, copper, or zirconium. Besides silicon and germanium, other metals such as magnesium, copper, and zirconium can enhance the response of the system to annealing.

According to an embodiment, a method of fabricating a Josephson junction device includes forming a substrate, forming a base electrode layer over the substrate, forming a tunnel barrier layer over the base electrode layer, forming a first portion of a top electrode layer over the tunnel barrier layer, forming a dopant layer over the first portion, and forming a second portion of the top electrode layer over the dopant layer. The dopant can improve the control of the change of resistance/frequency in response to annealing.

In some embodiments, which can be combined with the previous embodiment, upon forming the second portion of the top electrode layer, the Josephson junction device is annealed. The change in the resistance/frequency of the device once the device is heated plays a crucial role in the operation of the device.

In some embodiments, which can be combined with one or more previous embodiments, forming the dopant layer further comprises tuning a response of a resistance of the Josephson junction device to heating. By providing dopant, e.g., silicon, the dopant layer enables tuning the response of the device to heating.

In some embodiments, which can be combined with one or more previous embodiments, the dopant layer is made of silicon or germanium. Silicon and germanium enhance the response of the system to annealing.

In some embodiments, which can be combined with one or more previous embodiments, the dopant layer is made of magnesium, copper, or zirconium. Besides silicon and germanium, other metals such as magnesium, copper, and zirconium can enhance the response of the system to annealing.

The concepts herein relate to Josephson junctions, which are devices made up of two superconductors separated by a thin insulating layer. When cooled to extremely low temperatures, the superconductors can exhibit quantum mechanical effects that allow electric current to flow through the insulating layer without resistance. The current flows through the insulator due to quantum tunneling of Cooper pairs. This tunneling current is very sensitive to electromagnetic fields, allowing precise measurements. An alternating current applied to the junction can generate an oscillating voltage, with the frequency proportional to the amplitude of the current. This allows extremely precise measurements of voltages. Further, tiny changes in a magnetic field perpendicular to the junction alter the tunneling current. This makes the Josephson junctions useful for measuring small magnetic fields. Even further, the Josephson junctions can be used as superconducting quantum interference devices (SQUIDs). When arranged in a loop, Josephson junctions act as extremely sensitive detectors of magnetic flux, enabling applications like brain imaging. Josephson junctions can further exhibit quantum effects such as entanglement and superposition, which makes them useful components in experimental quantum computers.

Maintaining high gate fidelities for all pairs in a lattice will involve solving this frequency-crowding problem by precise setting of qubit frequencies to specified values, as characterized by a standard deviation. To achieve the appropriate standard deviation, the tunnel-junction conductance should be controlled with high precision. In typical transmons, a photolithographically defined capacitance has dimensions in the tens to hundreds of microns and varies little from qubit to qubit. The critical current is set by a tunnel barrier of area ~100×100 nm and thickness a few nanometers and is thus challenging to fabricate with precision better than a few percent. However, tunnel barrier resistance is readily measurable to precision better than 0.1% and relates to the critical current. Imprecision in resistance can produce a corresponding imprecision in frequency. Thus, the barrier resistance can be measured before a chip is cooled in order to assess qubit frequency imprecision.

By designing the lattices, the error correction codes can be enabled, while at the same time minimizing the likelihood of frequency collisions and therefore the appropriate standard deviation for fabrication yield are attained. Yet, a fractional standard deviation of at least 0.25-0.5% is appropriate, which represents a factor of 2-4 improvement over the current technology. To overcome such limits will require rework of individual qubits' tunnel junctions after fabrication. Thermal annealing has been shown to increase tunnel resistance, and laser heating has been demonstrated as a highly localized rework tool. However, the inherent variability of the annealing process itself should be overcome, and qubit frequency control utilizing such techniques at scale has not been attained.

Thus, fabricating transmon qubits with precise frequency/resistance values has been a challenge, and it is usually necessary to adjust the frequency of a completed qubit. This adjustment is preferentially made by annealing the Josephson junction, for example with a laser. However, it may not always be possible to obtain the required resistance change due to poor control of the resistance of the junctions and variability in the resistance change attainable by annealing.

Further, a related problem is that frequency/resistance values may drift with time after fabrication.

To tackle the above-mentioned and other problems, disclosed is a Josephson junction device including a Josephson junction with added dopants to the junction metal to control the amount of resistance change attainable on annealing. Dopants may be added during junction fabrication, under the metal depositions, over the metal depositions, or in the metal depositions.

In an embodiment, the dopant may be co-deposited, using a single or multiple sources. Suitable dopants can increase the resistance change caused by annealing and other dopants may reduce the resistance drift under ambient conditions. In various embodiments, other dopants can be deposited after full junction build, in a separate, additional fabrication step.

Accordingly, the teachings herein provide methods and systems of a Josephson junction with added dopants structure. The techniques described herein may be implemented in a number of ways. Example implementations are provided below with reference to the following figures.

Example Josephson Junction with Added Dopant Structure

Figure 2:
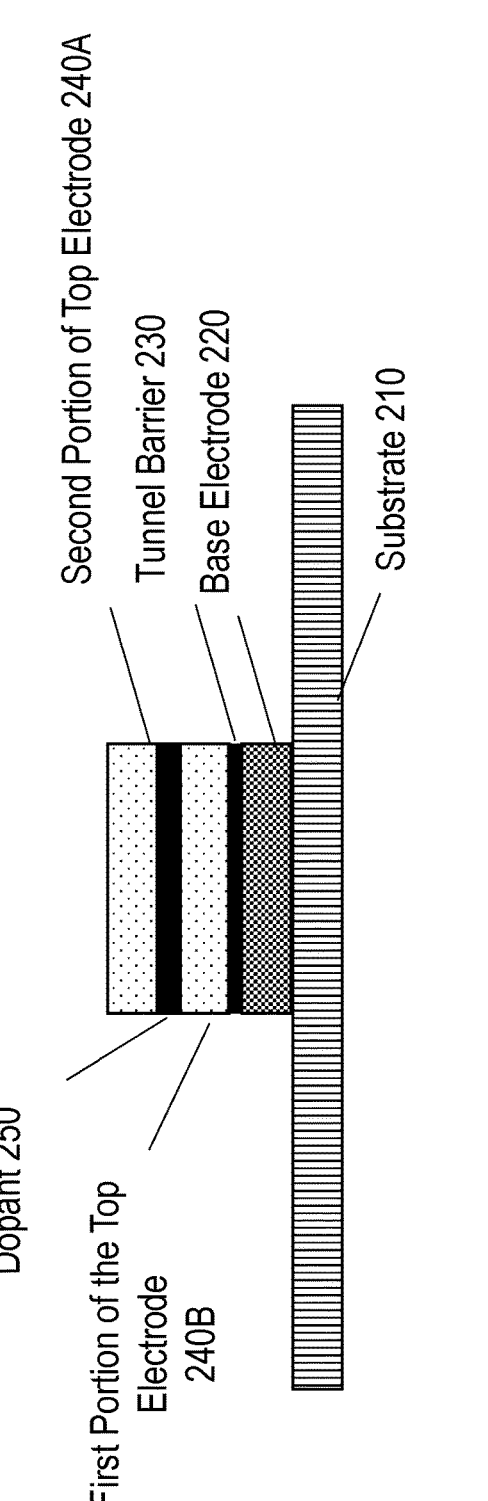
FIG. 2 illustrates a simplified view of the Josephson junction with added dopant, in accordance with some embodiments.

Reference now is made to FIGS. 1 and 2, which are cross-section views of a Josephson junction with added dopant device, consistent with an illustrative embodiment. FIG. 1 is a simplified view of the Josephson junction with added dopant device 100, in which the dopant is formed over the substrate, while FIG. 2 depicts the Josephson junction with added dopant device in which the dopant is formed within one of the electrodes. In some embodiments, the Josephson junction with added dopant device 100 includes a substrate 110, a base electrode 120, a barrier 130, a top electrode 140, and a dopant 150.

The Josephson junction with added dopant device 100 can be an element in superconducting qubits such as transmission line shunted plasma oscillation qubit, hereinafter "transmons". Transmons are a variant of superconducting qubit that encode quantum information in microwave transmission lines, and function as artificial atoms, storing quantum information in the state of a microscopic circuit including Josephson junctions. Compared to other superconducting qubits, Transmons have longer coherence times and are less susceptible to noise, and can include a Josephson junction shunted by a large capacitor, connected to superconducting electrodes.

Generally, the Josephson junction can be fabricated by isolating two superconductors with a thin insulating barrier. When shunted with a capacitor, the non-linear inductance from the junction forms an anharmonic oscillator making energy levels individually addressable. The efficient design of quantum circuits using such qubits involves precise control of the frequencies of the many qubits.

As mentioned earlier, of particular concern is the control of the junction resistance since this resistance determines the qubit frequency. Specifically, this frequency, which is related to the junction critical current, scales with the inverse of the square root of the junction resistance. For example, a 2% change in the resistance results in a 1% change in the qubit frequency. In some embodiments, to achieve the desired frequencies, laser annealing is used to trim the junction resistance and incrementally adjust junction resistance on a qubit-by-qubit basis, to overcome the inherent variability in both initial qubit fabrication.

In various embodiments, the response of junction resistance to annealing to a given temperature is dependent on processing conditions. For example, a Josephson junction made on a silicon dioxide or sapphire substrate has a very different change in resistance for a given annealing temperature than a Josephson junction made on bare silicon. In some embodiments, the difference is due to the availability of silicon atoms to reach the aluminum electrodes. Further, the response, or tunability, can be significantly changed by adding different materials, e.g., silicon or germanium, to the electrodes. In some embodiments, other dopants are added to the electrodes to moderate the response of the junction to annealing.

Referring back to FIG. 1 now, the Josephson junction with added dopant device 100 includes the substrate 110 which can be a silicon substrate. The substrate 110 provides a solid foundation to build the thin-film layers of the Josephson junction with added dopant device 100 on. The substrate material impacts properties such as dielectric constant and loss tangent which can affect the performance of the Josephson junction with added dopant device 100. While in some embodiments, silicon is used as the substrate, in some embodiments, other materials such as sapphire or magnesium-oxide, which are insulating substrates used for high-quality, low-loss Josephson junctions; silicon carbide, which is used for high-frequency Josephson junction circuits; and lanthanum aluminate, which is used for low-loss substrate suitable for qubit integration, can be used.

The dopant 150 is formed over the substrate 110. The dopant can be silicon, germanium, magnesium, copper, zirconium, or any other suitable dopant. The dopant 150 can be deposited over the substrate 110 prior to forming the base electrode 120. In some embodiments, the dopant 150 has a thickness of about 10 nanometers. Dopant materials, such as silicon, will often have low solubility in the electrode layers. As such, the added dopant layers do not need to be as thick as the electrode layers. When placed inside the base electrode, as in FIG. 2, the layer should be kept thin enough to be discontinuous after annealing, with a range of as little as 1 to 10 nm, to avoid adding an extra resistance in the current path. Such considerations do not apply to the case of FIG. 1 where the dopant is under the base electrode.

The Josephson junction with added dopant device 100 includes two electrodes, typically superconducting metal electrodes, separated by a thin insulating layer, i.e., the tunnel barrier 130. In some embodiments, the base electrode 120 is deposited over the dopant 150. The base electrode 120 can be made of niobium, aluminum, lead, and tin. In some embodiments, the base electrode 120 has a thickness of about 30 nanometers.

The tunnel barrier 130 in the Josephson junction with added dopant device 100 is formed between the base electrode 120 and the top electrode 140. The tunnel barrier 130 is a thin insulating layer separating the base electrode 120 and the top electrode 140. The tunnel barrier 130 allows current to flow through tunneling. The tunnel barrier 130 can be made of an oxide layer such as aluminum oxide or silicon oxide.

The top electrode 140 is deposited over the tunnel barrier 130 to form the Josephson junction with added dopant device 100. The top electrode 140 can be made of niobium, aluminum, lead, and tin. In some embodiments, the top electrode 140 is made of the same material as the base electrode 120. Optionally, in some embodiments, the top electrode 140 is made of a material that is different than the base electrode 120. In one example, the top electrode 140 has a thickness of about 60 nanometers. It should be noted that at the expense of an added lithographic processing step, the dopant can be deposited after the top electrode is deposited.

Referring now to FIG. 2, a Josephson junction with added dopant device in which the dopant is formed within one of the electrodes is shown. In some embodiments, the Josephson junction with added dopant device 200 includes a substrate 210, a base electrode 220, a barrier 230, a first portion of the top electrode 240A, a second portion of the top electrode 240B, and a dopant 250.

The substrate 210 can be a silicon substrate and provides a solid foundation to build the thin-film layers of the Josephson junction with added dopant device 200 on. The substrate material impacts properties such as dielectric constant and loss tangent which can affect the performance of the Josephson junction with added dopant device 200. While in some embodiment's silicon is used as the substrate, in other embodiments, other materials such as sapphire or magnesium-oxide, which are insulating substrates used for high-quality, low-loss Josephson junctions; silicon carbide, which is used for high-frequency Josephson junction circuits; and lanthanum aluminate, which is used for low-loss substrate suitable for qubit integration, can be used.

The Josephson junction with added dopant device 200 includes two electrodes, typically superconducting metal electrodes, separated by a thin insulating layer, i.e., the tunnel barrier 230. In some embodiments, the base electrode 220 is deposited over the substrate 210. The base electrode 220 can be made of niobium, aluminum, lead, and tin. The base electrode 220 can have a thickness of about 30 nanometers.

The tunnel barrier 230 in the Josephson junction with added dopant device 200 is formed between the base electrode 220 and the top electrode. The tunnel barrier 230 is a thin insulating layer separating the base electrode 220 and the top electrode. The tunnel barrier 230 allows current to flow through tunneling. The tunnel barrier 230 can be made of an oxide layer such as aluminum oxide or silicon oxide.

The top electrode can be split into a first portion of the top electrode 240A and a second portion of the top electrode 240B. The first portion of the top electrode 240A is deposited over the tunnel barrier 230 to form the initial Josephson junction. The first portion of the top electrode 240A can be made of niobium, aluminum, lead, and tin. In some embodiments, the first portion of the top electrode 240A is made of the same material as the base electrode 220. Optionally, in some embodiments, the first portion of the top electrode 240A is made of a material that is different than the base electrode 220.

The dopant 250 is formed over the first portion of the top electrode 240A. The dopant 250 can be silicon, germanium, magnesium, copper, zirconium, or any other suitable dopant. The dopant 250 can be deposited between the first portion of the top electrode 240B and the second portion of the top electrode 240B by splitting the deposition of the entire top electrode into deposition of the first portion of the top electrode 240B, deposition of the dopant 250, and deposition of the second portion of the top electrode 240B. In some embodiments, the dopant 250 has a thickness of about 10 nanometers.

The second portion of the top electrode 240B is deposited over the dopant 250 to form the final Josephson junction. The second portion of the top electrode 240B can be made of niobium, aluminum, lead, and tin. In some embodiments, the second portion of the top electrode 240B is made of the same material as the base electrode 220 and/or the first portion of the top electrode 240A. Optionally, in some embodiments, the second portion of the top electrode 240B is made of a material that is different than the base electrode 220 and/or the first portion of the top electrode 240A. In some embodiments, the total length of the first portion of the top electrode 240A and the second portion of the top electrode 240B is about 60 nanometers.

Figure 3A:
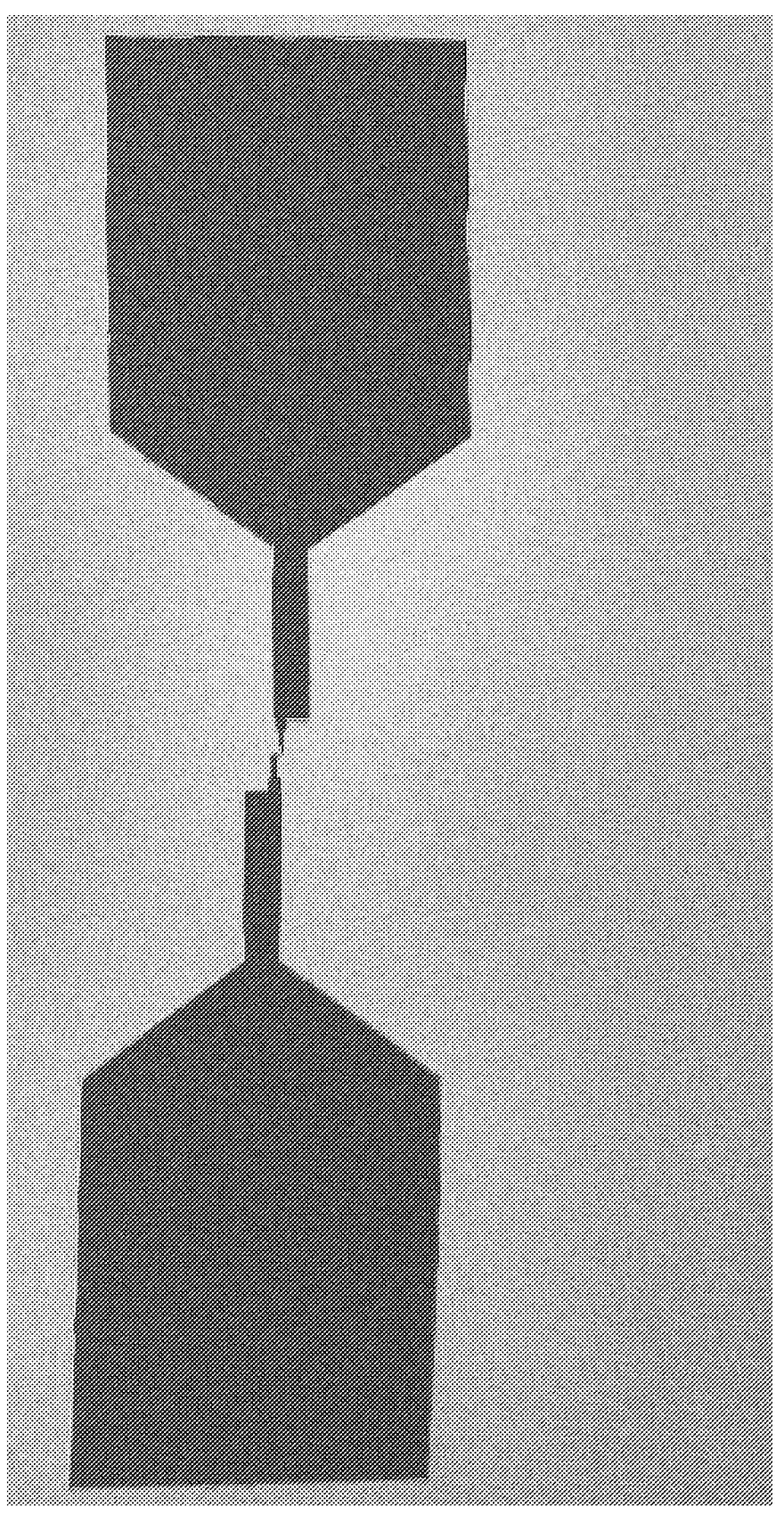
FIGS. 3A-3B illustrate electron microscopic images of the Josephson junction with added dopant, in accordance with some embodiments.
Figure 3B:
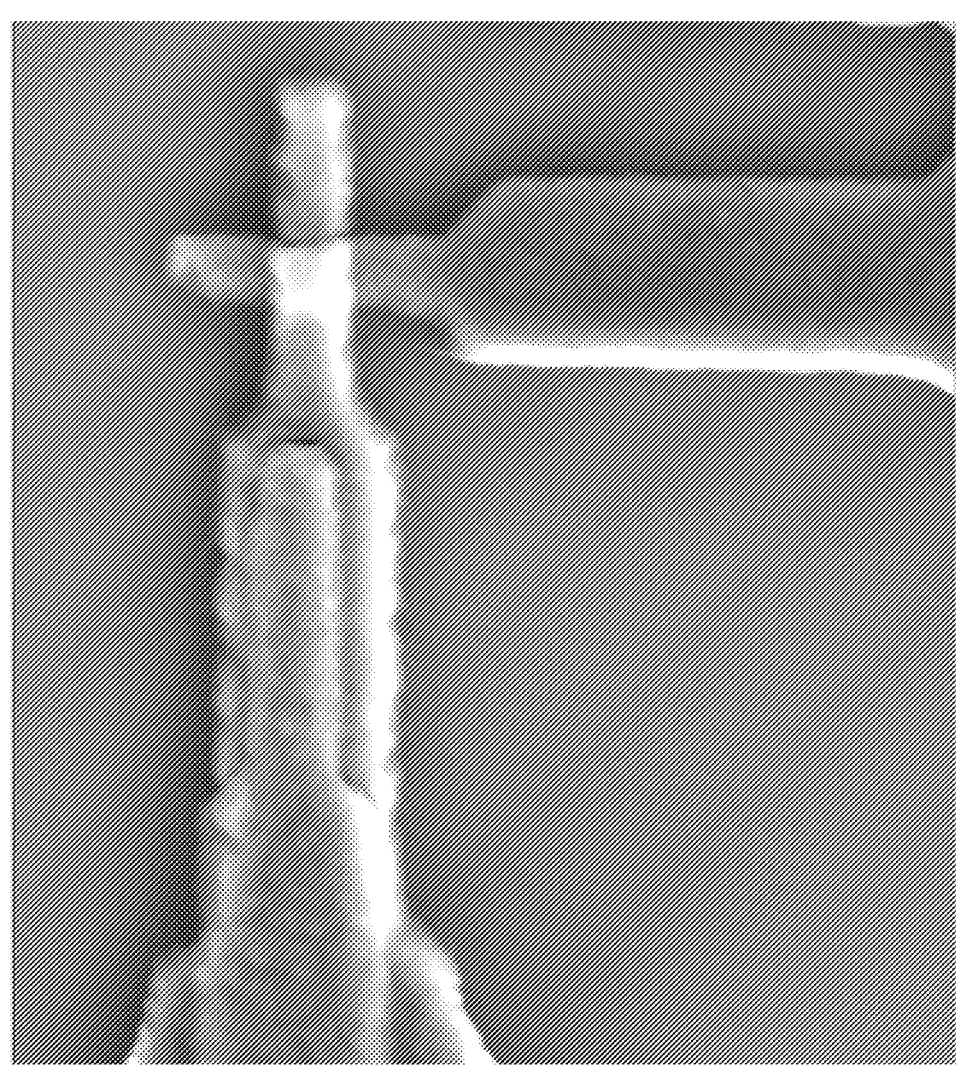

FIGS. 3A-3B illustrate electron microscopic images of the Josephson junction with added dopant device, in accordance with some embodiments. FIG. 3A, shows a Josephson junction and pads made of aluminum, which is fabricated by using a two-angled evaporation with oxidation after the first aluminum electrode is deposited. FIG. 3B illustrates a Josephson junction fabricated under the same conditions as FIG. 3A, which shows two perpendicular electrodes and the resulted Josephson junction.

Figure 4A:
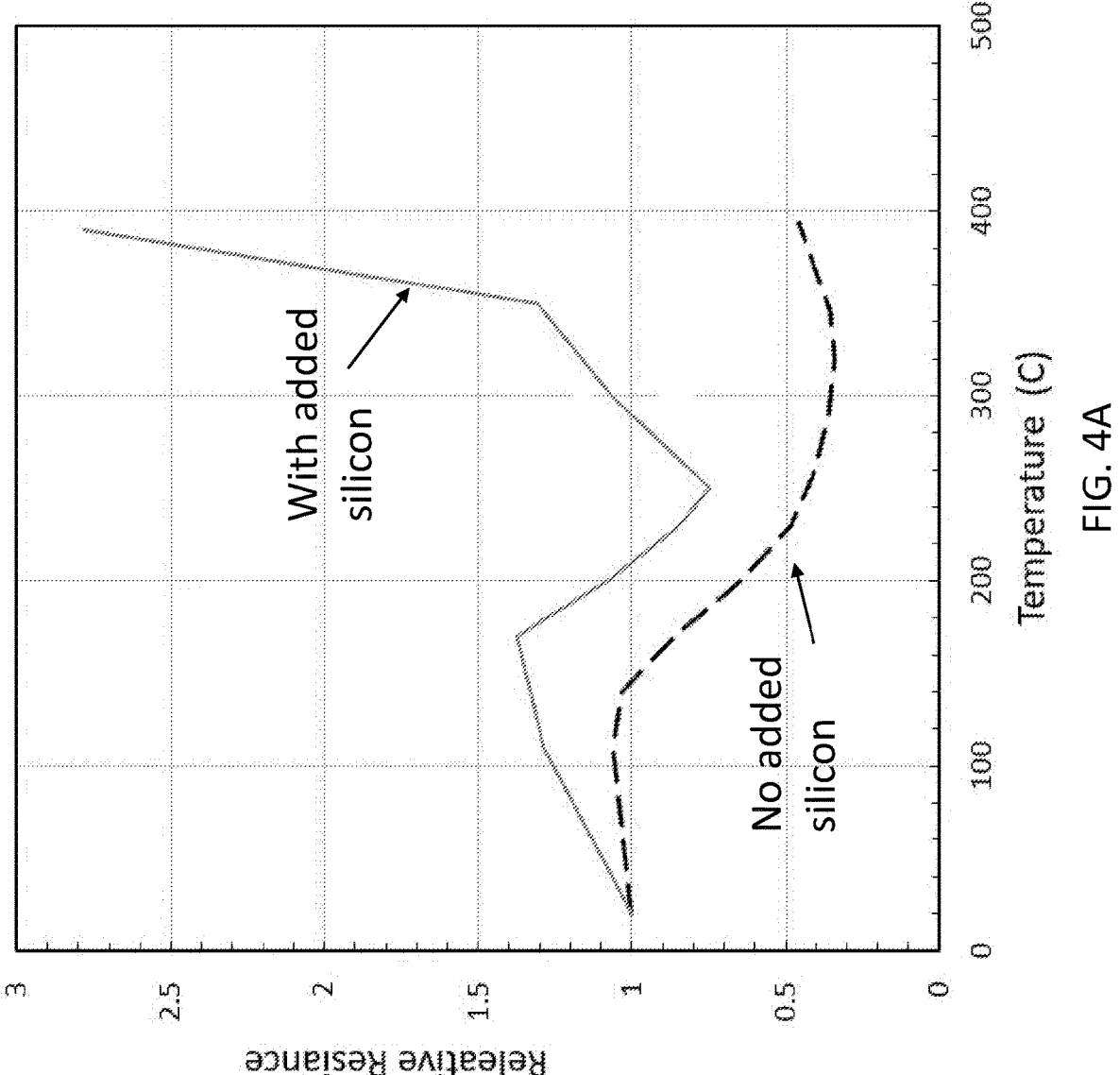
FIG. 4A illustrates the effect of silicon as a dopant on the resistance of the Josephson junction with added dopant, in accordance with some embodiments.

Reference is now made to FIG. 4A, which illustrates the effect of silicon as a dopant on the resistance of the Josephson junction with added dopant device, in accordance with some embodiments. Once the Josephson junction with added dopant device is formed, according to the processes described in related to FIG. 1 or FIG. 2, where a 10 nanometer-thick silicon is formed between the base electrode and the top electrode, the Josephson junction with added dopant device is heated to measure its response to increased temperature. In various embodiments, the Josephson junction with added dopant device can be heated using a laser source. Optionally, in some embodiments, the Josephson junction with added dopant device is annealed on a hot plate or in an oven. The response of the Josephson junction with added dopant device to heating is represented by FIG. 4A. As shown, the response of the Josephson junction, i.e., change in resistance or frequency, with added dopant device to heating drastically changes when dopant, i.e., silicon, is added to the Josephson junction with added dopant device. Such a drastic change in response is emphasized at higher temperatures. As shown, while using the dopant can enable enhancing the resistance of the Josephson junction with added dopant device, in this case it was not possible to increase the resistance in the absence of the dopant.

Figure 4B:
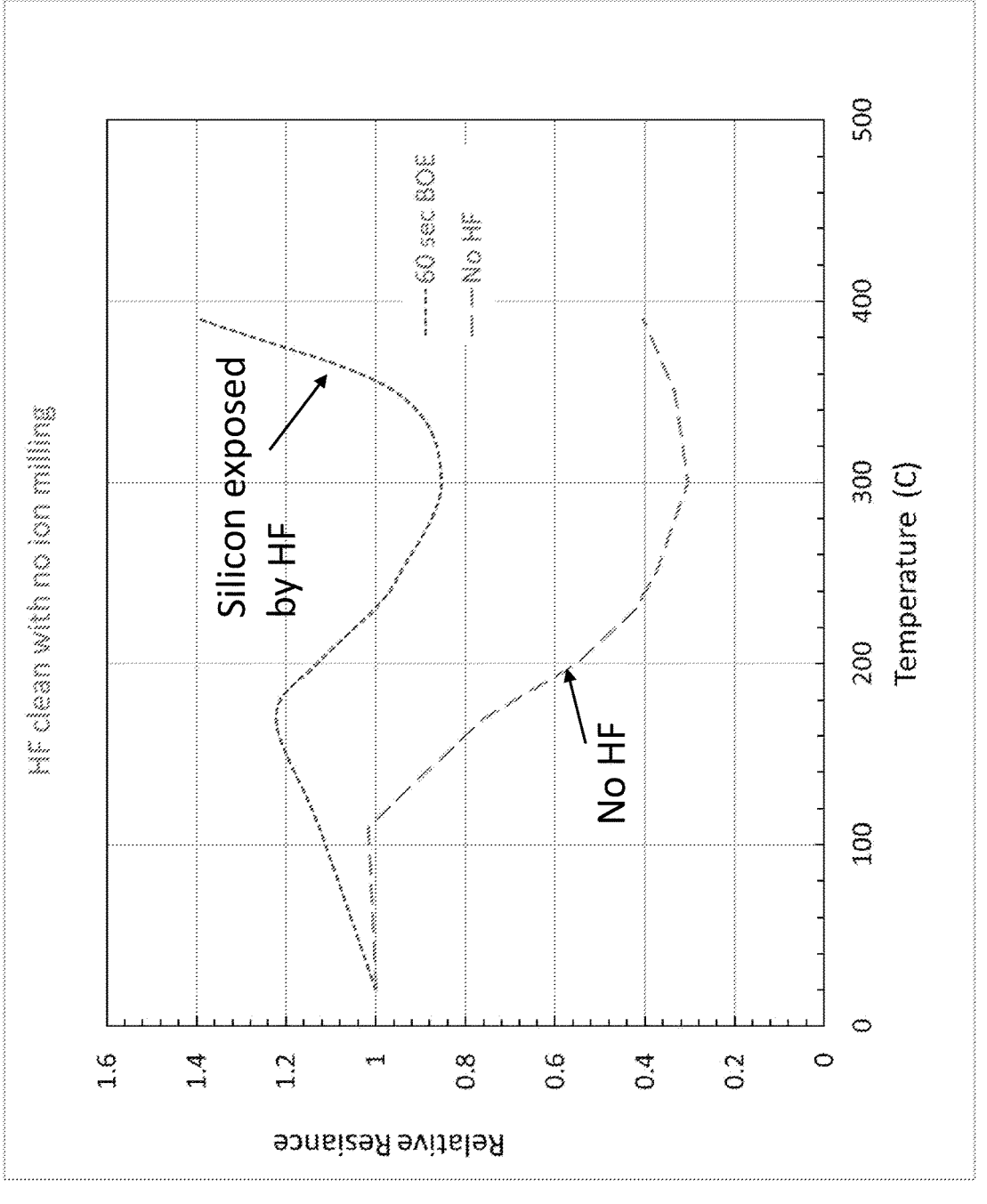
FIG. 4B illustrates the effect of removing the silicon dioxide from the surface of the substrate, thereby exposing the silicon as a dopant, on the resistance of the Josephson junction with added dopant, in accordance with some embodiments.

FIG. 4B illustrates the effect of removing the silicon from the surface of the substrate on the resistance of the Josephson junction with added dopant device, in accordance with some embodiments. In some embodiments, instead of adding a dopant to the Josephson junction with added dopant device, the oxide layer formed over the surface of the Josephson junction with added dopant device is removed, allowing the silicon of the substrate to serve as a dopant. In one interpretation, the change of resistance in response to heating is attributed to the presence of dopant. Thus, in some embodiments, in order to introduce dopant, e.g., silicon, to the Josephson junction with added dopant device, the oxide layer is removed prior to deposition of the base electrode and/or the top electrode, which can expose the silicon. By way of example and not limitation, dilute HF solution can be used to remove the oxide layer, i.e., to treat the surface of the Josephson junction with added dopant device. As shown in FIG. 4B, such native oxide removal drastically changes the subsequent response of junctions to heating.

Figure 5:
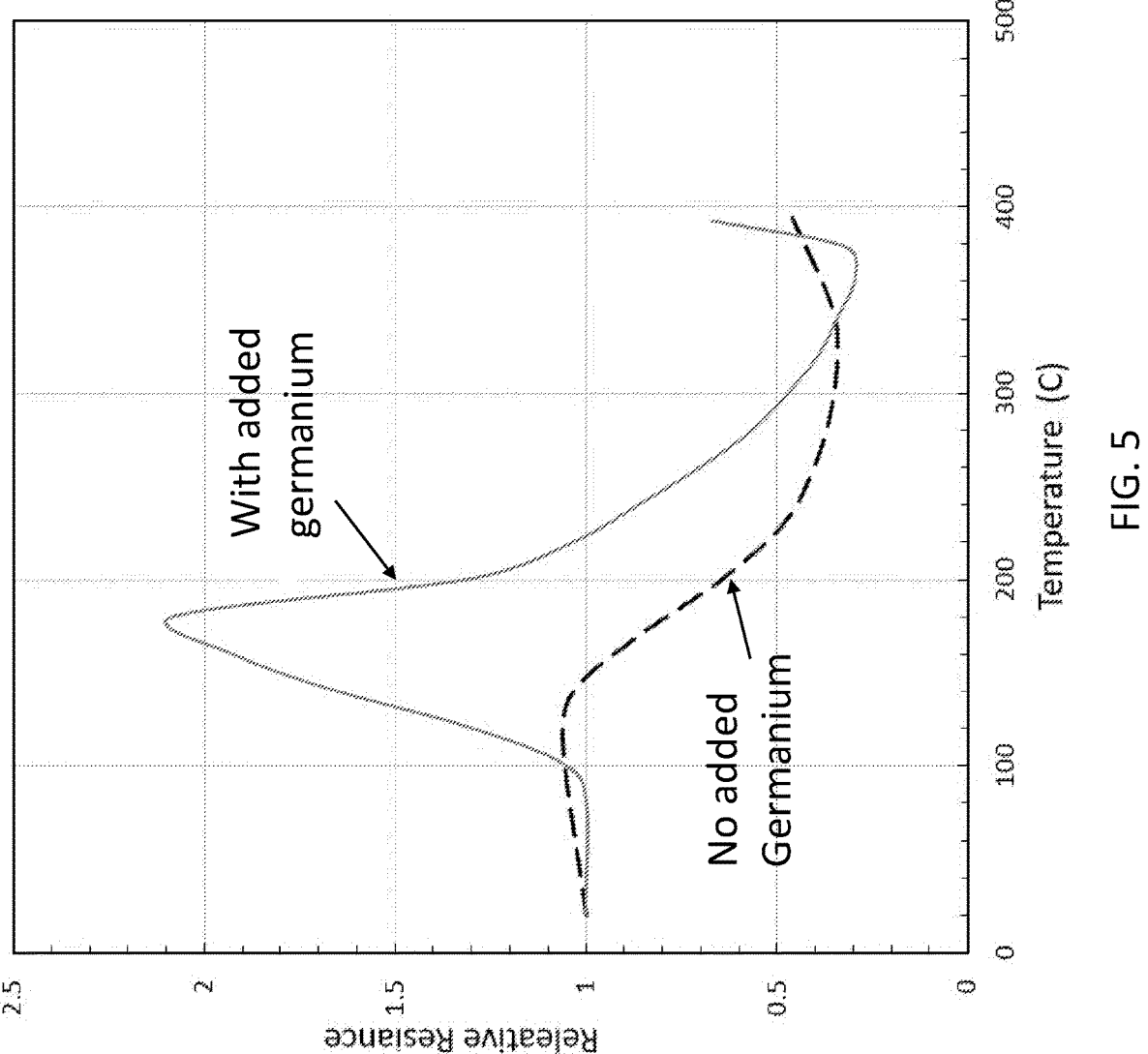
FIG. 5 illustrates the effect of germanium as a dopant on the resistance of the Josephson junction with added dopant, in accordance with some embodiments.

FIG. 5 illustrates the effect of germanium as a dopant on the resistance of the Josephson junction with added dopant device, in accordance with some embodiments. For example, once the Josephson junction with added dopant device is formed, according to the processes described in FIG. 2, where a 10 nanometer-thick germanium is formed within the top electrode, the Josephson junction with added germanium device is heated to measure its response to increased temperature. In various embodiments, the Josephson junction with added germanium device can be heated using a laser source. Optionally, in some embodiments, the Josephson junction with added germanium device is annealed. The response of the Josephson junction with added germanium device to heating is represented by FIG. 5. As shown, the response of the Josephson junction with added germanium device to heating drastically changes when dopant, i.e., germanium, is added to the Josephson junction. Such a drastic change in response is emphasized at higher temperatures. As shown, using germanium can enable drastically increasing and decreasing the resistance of the Josephson junction. As such, the presence of germanium as a dopant in the Josephson junction enables tuning the resistance of the Josephson junction.

Figure 6:
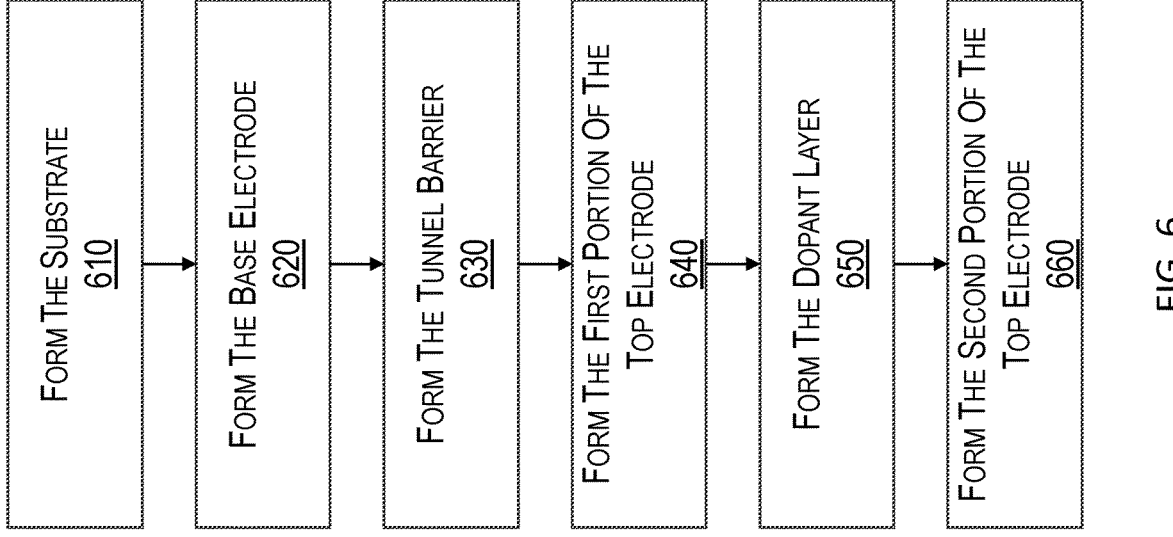
FIG. 6 illustrates a block diagram of a method for forming the Josephson junction with added dopant, in accordance with some embodiments.

FIG. 6 illustrates a block diagram of method 600 for fabricating a Josephson junction with added dopant device, in accordance with some embodiments. As shown by block 610, a substrate is formed. In various embodiments, silicon, sapphire, magnesium-oxide, silicon carbide, or lanthanum aluminate can be used as the substrate.

As shown by block 620, the base electrode is formed. In some embodiments, the base electrode is deposited over the substrate. In various embodiments, the base electrode can be made of niobium, aluminum, lead, and tin. In some embodiments, the base electrode has a thickness of about 30 nanometers.

As shown by block 630, the tunnel barrier is formed. The tunnel barrier in the Josephson junction with added dopant device is formed between the base electrode and the top electrode. The tunnel barrier is an insulating layer separating the base electrode and the top electrode. The tunnel barrier allows current to flow through tunneling. The tunnel barrier can be made of an oxide layer such as aluminum oxide or silicon oxide.

As shown by block 640, the first portion of the top electrode is formed. The top electrode can be split into a first portion of the top electrode and a second portion of the top electrode. The first portion of the top electrode is deposited over the tunnel barrier to form the initial Josephson junction. The first portion of the top electrode can be made of niobium, aluminum, lead, and tin. In some embodiments, the first portion of the top electrode is made of the same material as the base electrode. Optionally, in some embodiments, the first portion of the top electrode is made of a material that is different than the base electrode.

As shown by block 650, dopant layer is formed. The dopant can be silicon, germanium, magnesium, copper, zirconium, or any other suitable dopant. In some embodiments, the dopant has a thickness of about 10 nanometers.

As shown by block 660, the second portion of the top electrode is formed. The second portion of the top electrode is deposited over the dopant to form the final Josephson junction. The second portion of the top electrode can be made of niobium, aluminum, lead, or tin. In some embodiments, the second portion of the top electrode is made of the same material as the base electrode and/or the first portion of the top electrode. Optionally, in some embodiments, the second portion of the top electrode is made of a material that is different than the base electrode and/or the first portion of the top electrode. In some embodiments, the total length of the first portion of the top electrode and the second portion of the top electrode is about 60 nanometers.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A Josephson junction device comprising:
a substrate;
a base electrode layer;
a top electrode layer;
a tunnel barrier layer between the base electrode layer and the top electrode layer; and
a dopant layer, wherein the dopant layer is located between the base electrode layer and the substrate or is located within the top electrode layer.

2. The Josephson junction device of claim 1, wherein the dopant layer is located within the top electrode layer.

3. The Josephson junction device of claim 1, wherein the dopant layer is operative to change a response of a resistance of the Josephson junction device to heating.

4. The Josephson junction device of claim 1, wherein the dopant layer is made of silicon or germanium.

5. The Josephson junction device of claim 1, wherein the dopant layer is made of magnesium, copper, or zirconium.

6. The Josephson junction device of claim 1, wherein, the Josephson junction device is annealed.

7. The Josephson junction device of claim 1, wherein the base electrode layer has a thickness of about 20 to about 50 nanometers.

8. The Josephson junction device of claim 1, wherein the dopant layer has a thickness of about 1 nanometer to about 10 nanometers.

9. The Josephson junction device of claim 1, wherein the top electrode layer has a thickness of about 50 nanometers to about 100 nanometers.

10. A method of fabricating a Josephson junction device, the method comprising:
forming a dopant layer over a substrate;
forming a base electrode layer over the dopant layer;
forming a tunnel barrier layer over the base electrode layer; and
forming a top electrode layer over the tunnel barrier layer.

11. The method of claim 10, further comprising, upon forming the top electrode layer, annealing the Josephson junction device.

12. The method of claim 10, wherein forming the dopant layer further comprises tuning a response of a resistance of the Josephson junction device to heating.

13. The method of claim 10, wherein the dopant layer is made of silicon or germanium.

14. The method of claim 10, wherein the dopant layer is made of magnesium, copper, or zirconium.

15. A method of fabricating a Josephson junction device, the method comprising:
forming a base electrode layer over a substrate;
forming a tunnel barrier layer over the base electrode layer;
forming a first portion of a top electrode layer over the tunnel barrier layer;
forming a dopant layer over the first portion; and
forming a second portion of the top electrode layer over the dopant layer.

16. The method of claim 15, further comprising, upon forming the second portion of the top electrode layer, annealing the Josephson junction device.

17. The method of claim 15, wherein forming the dopant layer further comprises tuning a response of a resistance of the Josephson junction device to heating.

18. The method of claim 15, wherein the dopant layer is made of silicon or germanium.

19. The method of claim 15, wherein the dopant layer is made of magnesium, copper, or zirconium.

* * * * *